United States Patent

[11] 3,560,761

[72] Inventor John J. Kardash
Acton, Mass.
[21] Appl. No. 747,537
[22] Filed July 25, 1968
[45] Patented Feb. 2, 1971
[73] Assignee Sylvania Electric Products Inc.
a corporation of Delaware

[54] TRANSISTOR LOGIC CIRCUIT
3 Claims, 1 Drawing Fig.

[52] U.S. Cl. .......... 307/215, 307/289, 307/299
[51] Int. Cl. .......... H03k 19/34
[50] Field of Search .......... 307/247, 215

[56] References Cited

UNITED STATES PATENTS

| | | | |
|---|---|---|---|
| 3,081,407 | 3/1963 | Hall | 307/215 |
| 3,083,303 | 3/1963 | Knowles et al. | 307/215 |
| 3,233,125 | 2/1966 | Buie | 307/215 |
| 3,473,053 | 10/1969 | Kardash | 307/247 |

*Primary Examiner*—Donald D. Forrer
*Assistant Examiner*—Harold A. Dixson
*Attorneys*—Norman J. O'Malley, Elmer J. Nealon and David M. Keay

ABSTRACT: A transistor-transistor NAND logic circuit including a switching transistor between the input transistor and the final transistor at the output of the circuit. The switching transistor is regeneratively coupled to the input transistor and arranged so as to establish relatively high noise margins which must be exceeded by signals at the input connections to the input transistor in order to change the operating state of the circuit.

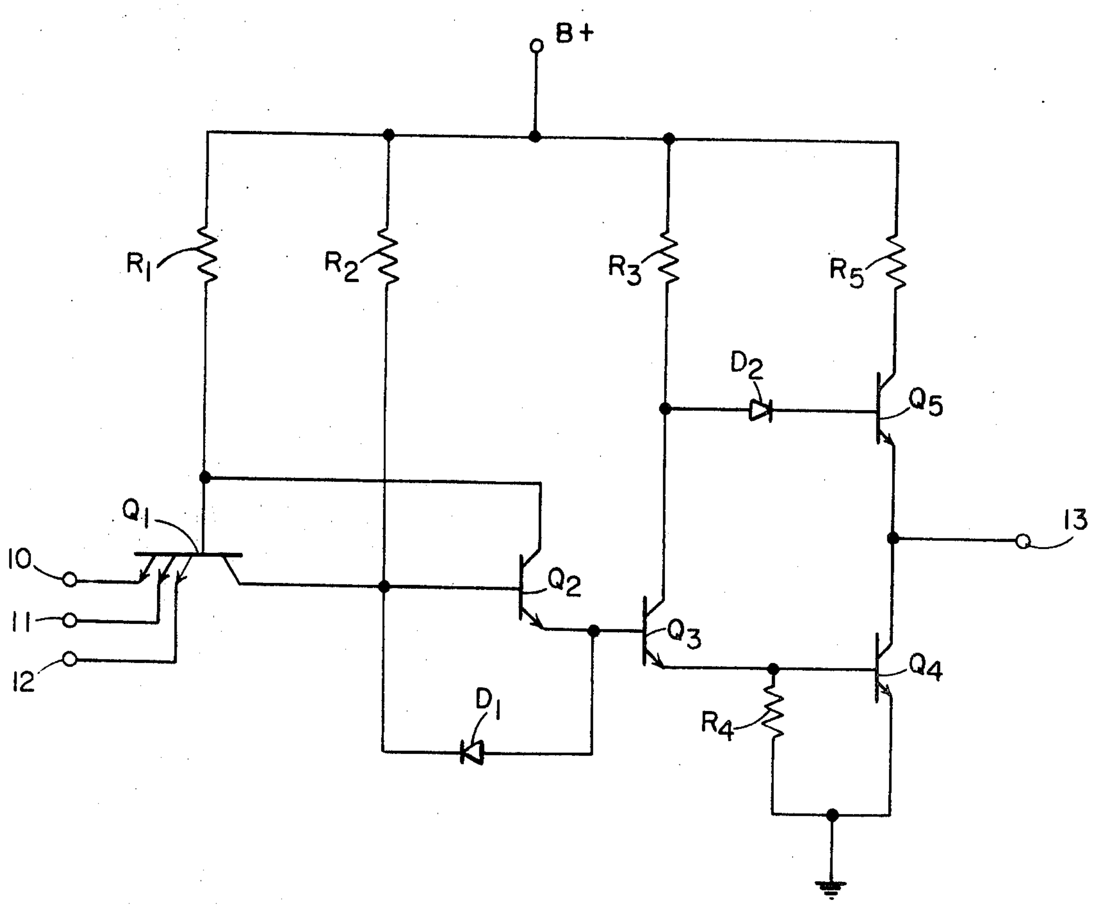
INVENTOR.
JOHN J. KARDASH
BY David M. Keay
AGENT.

TRANSISTOR LOGIC CIRCUIT

BACKGROUND OF THE INVENTION

This invention relates to transistor logic circuits. More particularly, it is concerned with digital logic circuits having high immunity to noise.

Various types of digital logic circuits which are particularly amenable to fabrication as monolithic integrated circuit networks have been developed. Of these, the so-called transistor-transistor logic type (TTL) has become widely accepted because of the availability of certain circuits having favorable switching speeds, power dissipation, immunity to noise, fanout (the number of succeeding logic circuits which can be operated with parallel input connections to the output connection of a given logic circuit) and capacitive load driving capability. However, in order to provide reliable operation in certain applications with a high noise environment it is desirable that logic circuits have greater immunity to noise than that ordinarily obtained with circuits heretofore available.

SUMMARY OF THE INVENTION

Improved immunity to noise is provided by logic circuits in accordance with the present invention. A logic circuit of the invention includes an input circuit means having input terminal means for applying input signals to the logic circuit and an output circuit means having an input connection connected to the input circuit means. The output circuit means operates in a first conduction condition or in a second conduction condition. The output circuit means is operable to switch from the second conduction condition to the first conduction condition when a first switching signal condition is present at the input connection, and is operable to switch from the first conduction condition to the second conduction condition when a second switching signal condition is present at the input connection.

A biasing means connects the output circuit means to the input circuit means and is operable to produce a first input biasing condition at the input circuit means when the output circuit means is in the first conduction condition and to produce a second input biasing condition at the input circuit means when the output circuit means is in the second conduction condition.

The input circuit means is operable to produce the first switching signal condition at the input connection of the output circuit means in response to the presence of a first input signal condition at the input terminal means while the second input biasing condition is being produced at the input circuit means, thereby causing the output circuit means to switch from the second conduction condition to the first conduction condition. The input circuit means is also operable to produce the second switching signal condition at the input connection of the output circuit means in response to the presence of a second input signal condition at the input terminal means while the first input biasing condition is being produced at the input circuit means, thereby causing the output circuit means to switch from the first conduction condition to the second conduction condition. The conduction condition of the output circuit means determines the output signal condition at the output terminal of the logic circuit.

BRIEF DESCRIPTION OF THE DRAWING

Various objects, features, and advantages of the logic circuit of the invention together with its mode of operation will be apparent from the following detailed discussion and the accompanying drawing wherein the single FIG. is a schematic circuit diagram of a NAND logic circuit according to the invention.

DETAILED DESCRIPTION OF THE INVENTION

The NAND circuit shown in the FIG. includes a multiple-emitter NPN input transistor $Q_1$ having the three emitters with three input terminals 10, 11, and 12 each connected to an emitter. The base of the input transistor $Q_1$ is connected through a resistance $R_1$ to a voltage source B+.

The collector of the input transistor $Q_1$ is connected directly to the base of an NPN switching transistor $Q_2$. The collector of the switching transistor $Q_2$ is connected directly to the base of the input transistor $Q_1$. A resistance $R_2$ is connected between the juncture of the collector of the input transistor $Q_1$ and the base of the switching transistor $Q_2$ n d the B+ voltage source. The emitter of the switching transitor $Q_2$ is connected through a forward-poled diode $D_1$ to its base.

The emitter of the switching transistor $Q_2$ is connected directly to the base of an NPN emitter-follower transistor $Q_3$. The collector of transistor $Q_3$ is connected through a resistance $R_3$ to the B+ voltage source and its emitter is connected through a resistance $R_4$ to ground. The emitter of the emitter-follower transitor $Q_3$ is also connected directly to the base of an NPN output transistor $Q_4$. The emitter of the output transistor $Q_4$ is connected directly to ground and its collector is connected directly to an output terminal 13. The collector of an output transistor $Q_4$ is also connected directly to the emitter of an NPN voltage-setting transistor $Q_5$ which has its collector connected through a resistance $R_5$ to the B+ voltage source. The juncture of the resistance $R_3$ and the collector of the emitter-follower transistor $Q_3$ is connected through a forward-poled diode $D_2$ to the base of the voltage-setting transistor $Q_5$.

When a relatively low level voltage condition is present at one or more of the three input terminals 10, 11, and 12, current flows from the B+ voltage s9urce through the base resistance $R_1$ and across the forward biased base-emitter junctions of the input transistor $Q_1$. Transistor $Q_1$ is thus heavily forward biased and operates in saturation. Heavy current flow in the collector circuit of transistor $Q_1$ flows from the B+ voltage source through resistance $R_2$ producing a very low voltage at the collector of transistor $Q_1$ and also at the base of transistor $Q_2$. Transistor $Q_2$ is thus biased to nonconduction.

With transistor $Q_2$ in the nonconduction condition, transistors $Q_3$ and $Q_4$ are similarly biased to nonconduction. The nonconducting output transistor $Q_4$ provides a high impedance between the output terminal 13 and ground. Current flowing from the B+ voltage source through resistance $R_3$ and the diode $D_2$ and across the base-emitter junction of the voltage-setting transistor $Q_5$ establishes a relatively high voltage level at the output terminal 13. Under these stable operating states the circuit can be considered OFF.

By way of example, the circuit as described may be connected to a B+ voltage source of 5-volts positive DC, and at least one of the input terminals 10, 11, and 12 may be connected to the output terminal of a similar preceding logic circuit. When the preceding circuit is ON and its output transistor is in saturation, the voltage at the emitter of the input transistor $Q_1$ connected to the preceding circuit is approximately .2 volts. The voltage level at the base of the switching transitor $Q_2$ exceeds the voltage at the emitter of transistor $Q_1$ by the collector-to-emitter voltage drop of the saturated input transistor $Q_1$. Typically the collector-to-emitter voltage drop of the saturated transistor $Q_1$ is approximately .2 volts, and the resulting voltage at the base of the switching transistor $Q_2$ is .4 volts. Since a typical base-to-emitter voltage drop in a conducting transistor is of the order of .7 volts, the voltage at the base of the switching transistor $Q_2$ is well below that required to bias the switching transistor $Q_2$ to conduction. The leakage current through resistance $R_3$ d iode $D_2$ a nd transistor $Q_5$ is such as to set the high level output condition at the output terminal 13 at approximately 3.3 volts.

As the lowest voltage level at the input terminals 10, 11, and 12 rises, as by preceding logic circuits being switched to OFF, the voltage level at the collector of the input transistor $Q_1$ also rises and the input transistor $Q_1$ continues to operate in saturation. Sufficient base current drive is provided to the base of the input transistor $Q_1$ by current flow from the B+ voltage source through the resistance $R_1$. When the lowest voltage level at the input terminals rises sufficiently, the base-emitter junction of the switching transistor $Q_2$ becomes forward biased and current flows through the switching transistor Q 2 into the base of the emitter-follower transistor $Q_3$. Current flows in the collector circuit of transistor $Q_2$ a king some of the current flowing through resistance $R_1$. Current also flows in the collector circuit of transistor $Q_3$ lowering the voltage at the output terminal 13.

As the voltage level at the base of the switching transistor $Q_2$ continues to increase, increased current flows through transistors $Q_2$ and $Q_3$ and into the base of transistor $Q_4$. Transistors $Q_3$ and $Q_4$ become biased into heavy conduction and the voltage level at the output terminal 13 drops. As the switching transistor $Q_2$ becomes more heavily forward biased, increased current flow in the collector circuit of the transistor $Q_2$ diverts sufficient current from the base of transistor $Q_1$ to take that transistor out of saturation.

At this point regenerative action takes place. As the input transistor $Q_1$ goes out of saturation, its collector current decreases and the voltage at the base of switching transistor $Q_2$ increases. This condition further increases the collector current flow through the switching transistor $Q_2$ diverting more current from the base of transistor $Q_1$. The switching transistor $Q_2$ goes into saturation and the input transistor $Q_1$ becomes nonconducting with its base-emitter junctions reverse biased.

The foregoing switching action takes place very rapidly as a positive-going input signal, or signals, is applied to the input terminals. The switching action is triggered to go to completion when the voltage level at the base of the switching transistor $Q_2$ becomes sufficiently high to initiate the regenerative action between the input transistor $Q_1$ and the switching transistor $Q_2$. The particular level is determined by the ratio of the values of resistance of biasing resistances $R_1$ and $R_2$. As an example, if resistance $R_1$ is 33,000 ohms and resistance $R_2$ is 50,000 ohms, regenerative switching action occurs when the voltage at the base of the switching transistor $Q_2$ is slightly greater than the total of the base-emitter voltage drops of transistors $Q_2$, $Q_3$, and $Q_4$, about 2.4 volts.

With the switching transistor $Q_2$ in saturation, transistors $Q_3$ and $Q_4$ are also in saturation. Current flows through the emitter-follower transistor $Q_3$ and the series connected resistances $R_3$ and $R_4$ producing a relatively low voltage level at the collector and a relatively high voltage level at the emitter. The output transistor $Q_4$ is biased to saturation providing a low impedance path between the output terminal 13 and ground and establishing a low voltage level at the output terminal. Typically the saturation voltage between the emitter and collector is of the order of .2 volts. The relatively low voltage at the base of the voltage-setting transistor $Q_5$ while the output terminal is at the low voltage level maintains that transistor in a substantially nonconducting condition. Under these stable operating conditions the circuit can be considered ON.

The circuit as described provides a relatively high noise margin which must be exceeded to switch the circuit from OFF TO ON. As explained the normal low voltage level at the input terminals 10, 11, and 12 is of the order of .2 volts. In order for the regenerative switching action to be initiated the voltage at the base of the switching transistor $Q_2$ must exceed 2.2 volts. This voltage level is reached when the voltage level at all of the input terminals 10, 11, and 12 is at least 2.0 volts. Thus, a noise margin of approximately 1.8 volts (2.0—.2) is provided.

With relatively high voltage-level signals applied at the input terminals 10, 11, and 12 the logic circuit in accordance with the invention remains in the stable ON state with transistors $Q_2$, $Q_3$ a nd $Q_4$ in saturation. The collector current of the switching transistor $Q_2$ flowing through resistance $R_1$ establishes a biasing condition on the base of the transistor $Q_1$ such that the high voltage-level input signals at the input terminals reverse bias all the base-emitter junctions. The switching transistor $Q_2$ is forward biased by current flowing into its base through resistance $R_2$.

In order for the circuit to be switched from ON to OFF the voltage level at at least one of the input terminals 10, 11, and 12 must decrease sufficiently to forward bias a base-emitter junction of the input transistor $Q_1$. The high voltage levels at the input terminals are normally approximately 3.3 volts as established by preceding logic circuits in the OFF state. The voltage at the base of the input transistor $Q_1$ is set by the collector-emitter voltage drop of the saturated transistor $Q_2$ and the base-emitter voltage drops of the two saturated transistors $Q_3$ n d $Q_4$, and typically is of the order of 1.9 volts. Thus, in order to forward bias a base-emitter junction of the input transistor $Q_1$ the voltage at one of the input terminals must be below the voltage at the base by an amount equal to the base-emitter voltage drop of the transistor. That is, the input voltage level at one of the input terminals must drop to approximately 1.2 volts.

When the voltage at one of the input terminals drops sufficiently to forward bias a base-emitter junction of the input transistor $Q_1$, current flows through the resistance $R_1$ and into the base of the transistor biasing it into conduction. This occurence triggers another regenerative switching action. The collector current of the input transistor $Q_1$ flows through the resistance $R_2$ lowering the voltage at the base of the switching transistor $Q_2$ and reducing its base drive current. Switching transistor $Q_2$ comes out of saturation and current flow in its collector circuit is reduced. Thus, additional current flows into the base of input transistor $Q_1$ biasing that transistor further into conduction. The regenerative action goes to completion with the input transistor $Q_1$ in saturation and the switching transistor $Q_2$ biased to nonconduction. The action of taking switching transistor $Q_2$ out of saturation is speeded up by diode $D_1$ which provides a short circuit path for charge carriers to flow out of the emitter and into the base.

When conduction ceases in the switching transistor $Q_2$, transistors $Q_3$ and $Q_4$ also become nonconducting. As conduction through the emitter-follower transistor $Q_3$ and the series connected resistances $R_3$ and $R_4$ decreases, the voltage at the collector of transistor $Q_3$ increases and that at the emitter decreases. When the output transistor $Q_4$ is in nonconduction, it presents a high impedance between the output terminal 13 and ground.

The increased voltage at the collector of transistor $Q_3$ together with the low voltage level present at the output terminal 13 biases the voltage-setting transistor $Q_5$ to a conducting condition. This transistor conducts heavily to drive the load on the output terminal until the voltage on the output terminal 13 reaches the predetermined high level established by the voltage of the b+ voltage source less the leakage current voltage drop across the resistance $R_3$, the diode $D_2$, and the base-emitter junction of the voltage-setting transistor $Q_5$. Restoration of the voltage at the output terminal to this higher level biases the voltage-setting transistor $Q_5$ o a substantially nonconducting condition. With these conditions stabilized the circuit is OFF.

Thus, the circuit provides a relatively high noise margin which must be exceeded to switch the circuit from ON to OFF.

Thus, the circuit provides a relatively high noise margin which must be exceeded to switch the circuit from ON to OFF. The normal high voltage level at the input terminals 10, 11, and 12 is of the order of 3.3 volts. As explained, in order for a base-emitter junction of the input transistor $Q_1$ to be forward biased initiating the regenerative switching action the voltage at at least one of the input terminals must drop below a 1.2 volt. Thus, a noise margin of approximately 2.1 volts (3.3-—1.2) is provided.

The NAND logic circuit according to the invention as described is amenable to fabrication as a monolithic integrated circuit network and has the desirable characteristics of known TTL circuits including favorable switching speeds, power dissipation, fan-out, and capacitive load driving capability. In addition, the circuit according to the invention has improved noise immunity rendering it useful for applications in high noise environments.

In the specific example, when the circuit if OFF, the voltage level at the input terminals may vary within a range from the normal input signal level of .2 volts up to 2.0 volts before the circuit switches ON. When the circuit is ON, the voltage level at the input terminals may vary within a range from the normal input signal level of 3.3 volts down to 1.2 volts before the circuit switches OFF. Since the normal low and high input signal voltage levels are .2 volts and 3.3 volts, respectively, the circuit provided provides relatively high noise margins while insuring that the circuit will respond to normal input signals.

While there has been shown and described what is considered a preferred embodiment of the present invention, it will be obvious to those skilled in the art that various changes and modifications may be made therein without departing from the invention as defined in the appended claims.

I claim:

1. A logic circuit including in combination:
input circuit means including:
an input transistor,
a first resistance connected between the base of the input transistor and a first source of reference potential; and
input terminal means connected to an emitter of the input transistor;
a switching transistor having its base connected to the collector of the input transistor and its collector connected to the base of the input transistor;
circuit means including an output transistor having its base coupled to the emitter of the switching transistor;
said switching transistor being operable to be switched from nonconduction to conduction in response to the presence at the input terminal means of input signal conditions causing the input circuit means to increase the voltage at the base of the switching transistor sufficiently to forward bias the switching transistor and the output transistor into conduction, whereby conduction in the switching transistor and the first resistance decreases the voltage at the base of the input transistor biasing the input transistor to nonconduction; and
said input transistor being operable to be switched from nonconduction to conduction in response to the presence at the input terminal means of input signal conditions forward biasing the input transistor into conduction, whereby conduction in the input transistor decreases the voltage at the base of the switching transistor biasing the switching transistor and the output transistor to nonconduction.

2. A logic circuit in accordance with claim 1 including:
a second resistance connected between the collector of the input transistor and the first source of reference potential and wherein;
the collector of the output transistor is coupled to the first source of reference potential and the emitter of the output transistor is connected to a second source of reference potential.

3. A logic circuit in accordance with claim 2 wherein said circuit means includes:
an emitter-follower transistor having its base connected to the emitter of the switching transistor, its collector coupled to the first source of reference potential, and its emitter connected to the base of the output transistor.